United States Patent
Sadjadi et al.

(10) Patent No.: US 7,491,647 B2
(45) Date of Patent: Feb. 17, 2009

(54) ETCH WITH STRIATION CONTROL

(75) Inventors: S. M. Reza Sadjadi, Saratoga, CA (US); Peter Cirigliano, Sunnyvale, CA (US); Ji Soo Kim, Pleasanton, CA (US); Zhisong Huang, Fremont, CA (US); Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 488 days.

(21) Appl. No.: 11/223,363

(22) Filed: Sep. 9, 2005

(65) Prior Publication Data

US 2006/0194439 A1 Aug. 31, 2006

Related U.S. Application Data

(63) Continuation-in-part of application No. 11/076,087, filed on Mar. 8, 2005, now Pat. No. 7,241,683.

(51) Int. Cl.
*H01L 21/311* (2006.01)

(52) U.S. Cl. .............. 438/696; 438/637; 438/942; 438/949; 257/E21.023

(58) Field of Classification Search ............. 438/637, 438/696, 942, 949
See application file for complete search history.

(56) References Cited

U.S. PATENT DOCUMENTS

| | | | |
|---|---|---|---|
| 4,151,034 A | 4/1979 | Yamamoto et al. |
| 4,414,059 A | 11/1983 | Blum et al. |
| 4,795,529 A | 1/1989 | Kawasaki et al. |
| 5,273,609 A | 12/1993 | Moslehi |
| 5,296,410 A | 3/1994 | Yang |
| 5,328,810 A | 7/1994 | Lowrey et al. |
| 5,498,312 A | 3/1996 | Laermer et al. |
| 5,501,893 A | 3/1996 | Laermer et al. |
| 5,562,801 A | 10/1996 | Nulty |
| 5,882,535 A | 3/1999 | Stocks et al. |

(Continued)

FOREIGN PATENT DOCUMENTS

DE 10059836 A1 6/2002

(Continued)

OTHER PUBLICATIONS

Eto et al., "High Selectivity Photoresist Ashing by the Addition of $NH_3$ to $CF_4/O_2$ or $CHF_3/O_2$", SID 99 Digest, pp. 844-847.

(Continued)

*Primary Examiner*—Zandra Smith
*Assistant Examiner*—Christy L Novacek
(74) *Attorney, Agent, or Firm*—Beyer Law Group LLP

(57) ABSTRACT

A method for etching a feature in an etch layer is provided. A patterned photoresist mask is formed over the etch layer with photoresist features with sidewalls wherein the sidewalls of the photoresist features have striations forming peaks and valleys. The striations of the sidewalls of the photoresist features are reduced. The reducing the striations comprises at least one cycle, wherein each cycle comprises etching back peaks formed by the striations of the sidewalls of the photoresist features and depositing on the sidewalls of the photoresist features. Features are etched into the etch layer through the photoresist features. The photoresist mask is removed.

18 Claims, 8 Drawing Sheets

U.S. PATENT DOCUMENTS

| | | |
|---|---|---|
| 5,942,446 A | 8/1999 | Chen et al. |
| 6,025,255 A | 2/2000 | Chen et al. |
| 6,046,115 A | 4/2000 | Molloy et al. |
| 6,051,503 A | 4/2000 | Bhardwaj et al. |
| 6,071,822 A | 6/2000 | Donohue et al. |
| 6,074,959 A | 6/2000 | Wang et al. |
| 6,100,200 A | 8/2000 | Van Buskirk et al. |
| 6,127,273 A | 10/2000 | Laermer et al. |
| 6,153,490 A | 11/2000 | Xing et al. |
| 6,187,685 B1 | 2/2001 | Hopkins et al. |
| 6,200,822 B1 | 3/2001 | Becker et al. |
| 6,211,092 B1 | 4/2001 | Tang et al. |
| 6,214,161 B1 | 4/2001 | Becker et al. |
| 6,261,962 B1 | 7/2001 | Bhardwaj et al. |
| 6,284,148 B1 | 9/2001 | Laermer et al. |
| 6,303,512 B1 | 10/2001 | Laermer et al. |
| 6,316,169 B1 | 11/2001 | Vahedi et al. |
| 6,326,307 B1 | 12/2001 | Lindley et al. |
| 6,368,974 B1 | 4/2002 | Tsai et al. |
| 6,387,287 B1 | 5/2002 | Hung et al. |
| 6,403,491 B1 | 6/2002 | Liu et al. |
| 6,406,995 B1 | 6/2002 | Hussein et al. |
| 6,489,632 B1 | 12/2002 | Yamazaki et al. |
| 6,569,774 B1 | 5/2003 | Trapp |
| 6,617,253 B1 | 9/2003 | Chu et al. |
| 6,632,903 B2 | 10/2003 | Jung et al. |
| 6,656,282 B2 | 12/2003 | Kim et al. |
| 6,740,977 B2 | 5/2004 | Ahn et al. |
| 6,750,150 B2 | 6/2004 | Chung et al. |
| 6,780,708 B1 | 8/2004 | Kinoshita et al. |
| 6,833,325 B2 | 12/2004 | Huang et al. |
| 6,916,746 B1 | 7/2005 | Hudson et al. |
| 6,924,191 B2 | 8/2005 | Liu et al. |
| 2004/0072430 A1 | 4/2004 | Huang et al. |
| 2004/0072443 A1 | 4/2004 | Huang et al. |
| 2004/0126705 A1 | 7/2004 | Lu et al. |
| 2005/0037624 A1 | 2/2005 | Huang et al. |
| 2005/0048787 A1 | 3/2005 | Negishi et al. |
| 2006/0115978 A1 | 6/2006 | Specht et al. |

FOREIGN PATENT DOCUMENTS

| | | |
|---|---|---|
| EP | 0822582 A2 | 2/1998 |
| JP | S63-13334 | 1/1988 |
| JP | 07226397 | 8/1995 |
| JP | 09036089 | 2/1997 |
| JP | 2001068462 | 3/2001 |
| WO | 00/30168 | 5/2000 |
| WO | 01/04707 | 1/2001 |
| WO | 01/29879 A2 | 4/2001 |
| WO | 01/29879 A3 | 4/2001 |
| WO | WO2004/093176 A1 * | 10/2004 |

OTHER PUBLICATIONS

International Search Report, dated Feb. 24, 2004.
International Search Report, dated Jun. 29, 2004.
International Search Report, dated Sep. 10, 2004.
U.S. Appl. No. 10/648,953, filed Aug. 26, 2003.
U.S. Appl. No. 10/674,675, filed Sep. 29, 2003.
U.S. Appl. No. 10/860,833, filed Jun. 3, 2004.
U.S. Appl. No. 10/946,181, filed Sep. 20, 2004.
U.S. Appl. No. 11/016,455, filed Dec. 16, 2004.
U.S. Appl. No. 11/055,878, filed Feb. 11, 2005.
U.S. Office Action mailed Oct. 20, 2003, from U.S. Appl. No. 10/295,601.
U.S. Office Action mailed May 27, 2004, from U.S. Appl. No. 10/295,601.
U.S. Office Action mailed Jun. 24, 2004, from U.S. Appl. No. 10/411,520.
U.S. Office Action mailed Oct. 5, 2004, from U.S. Appl. No. 10/648,953.
U.S. Office Action mailed Mar. 21, 2005, from U.S. Appl. No. 10/648,953.
U.S. Office Action mailed Jun. 23, 2005, from U.S. Appl. No. 10/674,675.
International Search Report and Written Opinion, mailed Oct. 11, 2006.

* cited by examiner

1

ETCH WITH STRIATION CONTROL

RELATED APPLICATIONS

This application is a continuation-in-part of U.S. patent application Ser. No. 11/076,087 entitled "Stabilized Photoresist Structure For Etching Process," by Hudson et al. filed Mar. 8, 2005, which is hereby incorporated by reference.

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Problems that may be encountered during this process are striation and limitations on critical dimensions (CD).

SUMMARY OF THE INVENTION

To achieve the foregoing and in accordance with the purpose of the present invention a method for etching a feature in an etch layer is provided. A patterned photoresist mask is formed over the etch layer with photoresist features with sidewalls wherein the sidewalls of the photoresist features have striations forming peaks and valleys. The striations of the sidewalls of the photoresist features are reduced. The reducing the striations comprises at least one cycle, wherein each cycle comprises etching back peaks formed by the striations of the sidewalls of the photoresist features and depositing on the sidewalls of the photoresist features. Features are etched into the etch layer through the photoresist features. The photoresist mask is removed.

In another manifestation of the invention a method of etching features in an etch layer disposed below a patterned photoresist mask with photoresist features with sidewalls wherein the sidewalls of the photoresist features have striations forming peaks and valleys is provided. The striations of the sidewalls of the photoresist features are reduced comprising at least one cycle, wherein each cycle comprises providing a striation peak etch back gas, generating a plasma from the striation peak etch back gas, stopping the striation peak etch back gas, providing a photoresist feature sidewall deposition gas, generating a plasma from the photoresist feature sidewall deposition gas, and stopping the photoresist feature sidewall deposition gas. The etch layer is etched. The photoresist mask is removed.

In another manifestation of the invention an apparatus for etching a feature in an etch layer, below a photoresist mask with photoresist features with sidewalls with striations forming peaks and valleys is provided. A plasma processing chamber, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A gas source is in fluid connection with the gas inlet, where the gas source comprises a striation peak etch back gas source, a photoresist feature sidewall deposition gas source, and an etch layer etch gas source. A controller is controllably connected to the gas source and the at least one electrode. The controller comprises at least one processor and computer readable media. The computer readable media comprises computer readable code for reducing the striations of the photoresist features, comprising a plurality of cycles, wherein each cycle comprises computer readable code for providing a striation peak etch back gas from the striation peak etch back gas source, computer readable code for generating a plasma from the striation peak etch back gas, computer readable code for stopping the striation peak etch back gas from the striation peak etch back gas source, computer readable code for providing a photoresist feature sidewall deposition gas from the photoresist feature sidewall deposition gas source, computer readable code for generating a plasma from the photoresist feature sidewall deposition gas, and computer readable code for stopping the photoresist feature sidewall deposition gas from the photoresist feature sidewall deposition gas. The computer readable media further comprises computer readable code for etching the etch layer and computer readable code for removing the photoresist mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
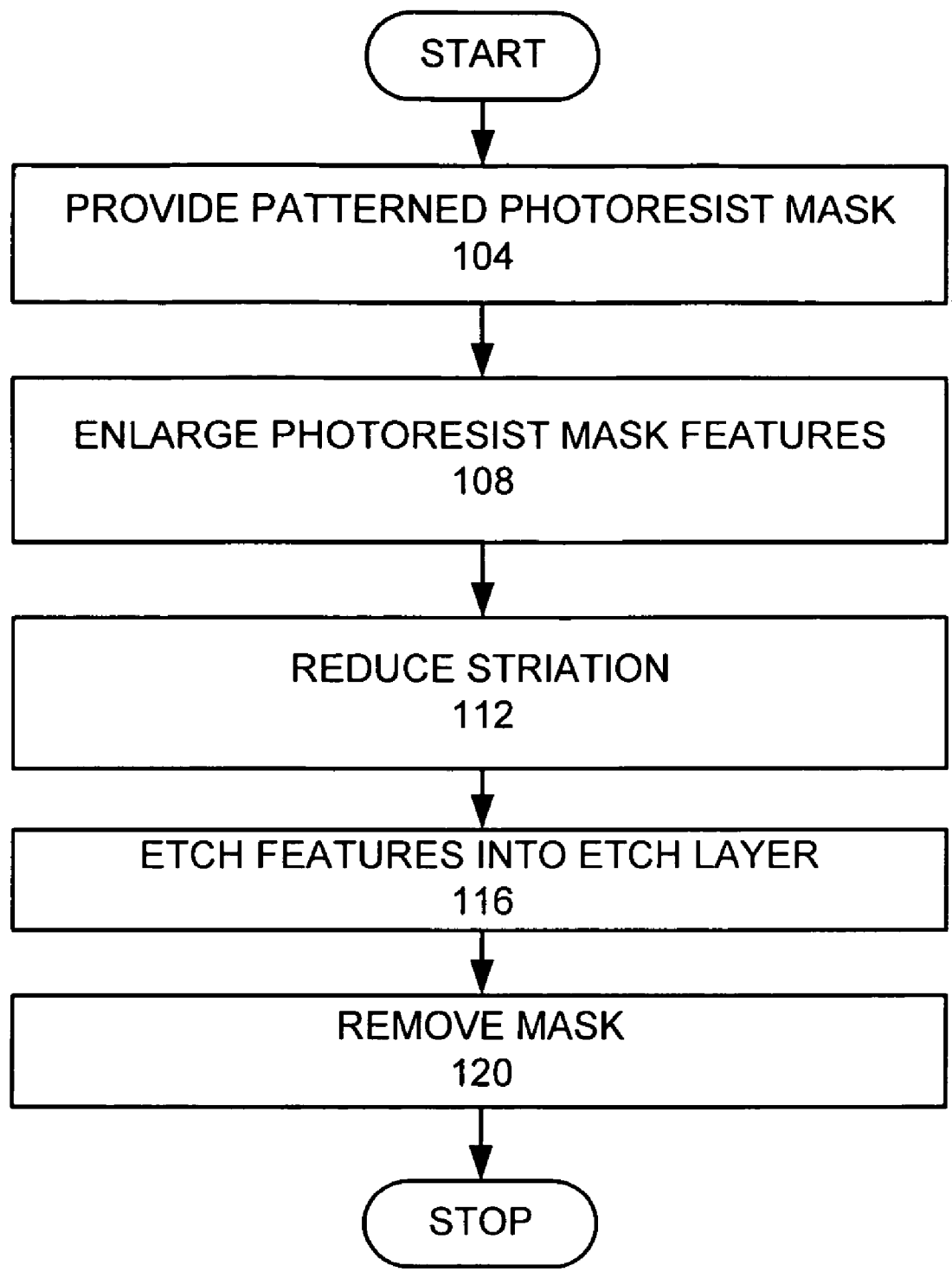
FIG. 1 is a high level flow chart of a process that may be used in an embodiment of the invention.
Figure 2A:
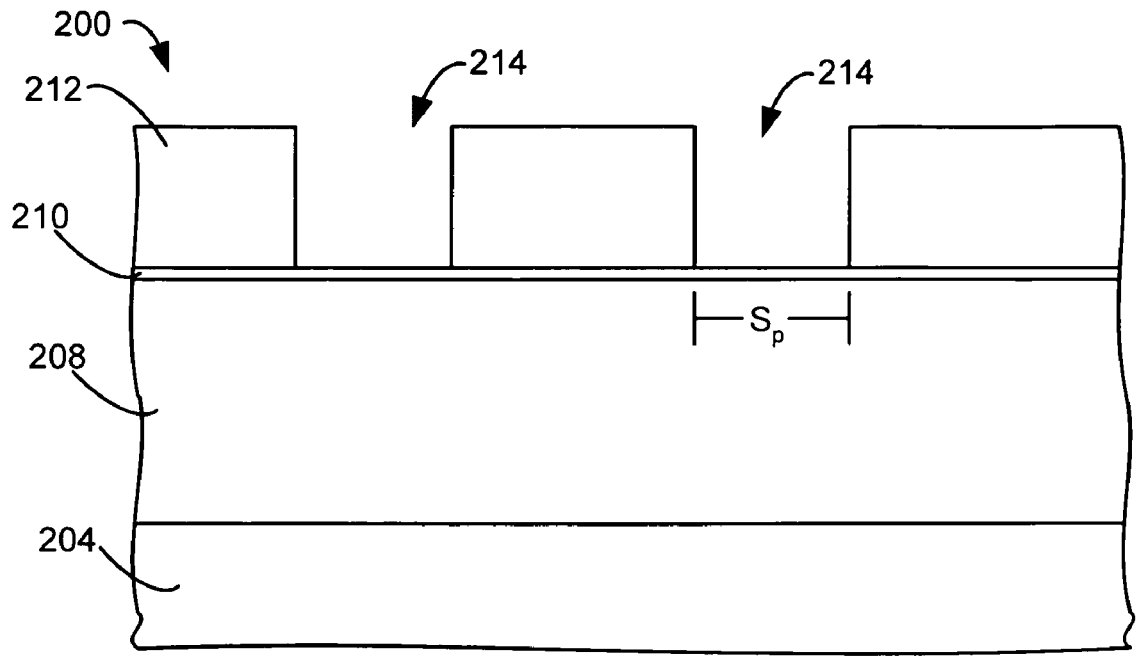
FIGS. 2A-I are schematic cross-sectional and top views of a stack processed according to an embodiment of the invention.
Figure 2B:
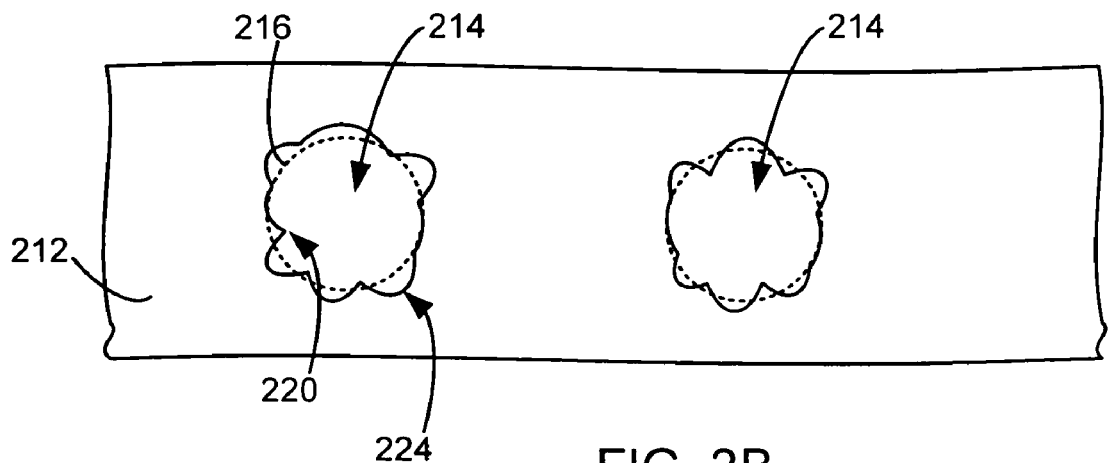

To facilitate understanding, FIG. 1 is a high level flow chart of a process that may be used in an embodiment of the invention. A patterned photoresist mask is provided (step 104). FIG. 2A is a schematic cross-sectional view of a layer to be etched 208 over a substrate 204, with a patterned photoresist mask 212 with photoresist features 214, over an ARL 210, over the layer 208 to be etched forming a stack 200. The photoresist mask has a photoresist feature critical dimension (CD), which may be the widest part of the width of the smallest possible feature. To provide the patterned photoresist mask, a photoresist layer may be first formed over the layer to be etched. Then the photoresist layer is patterned to form photoresist features with photoresist sidewalls. FIG. 2B is a top view of the photoresist mask 212. Generally, manufacturing processes, such as lithography, may cause the features 214 to be irregularly shaped. The dotted line circles 216 illustrate the reticle pattern provided for the photoresist mask 212. The actual photoresist openings may have sidewalls with peaks 220 and valleys 224, as shown. These peaks 220 and valleys 224, which cause the irregular shape that deviates from the original reticle pattern, in this case a circle, and often extends for some length along the sidewall, are called striations. The photoresist features have a diameter $S_p$, as shown.

Figure 2C:
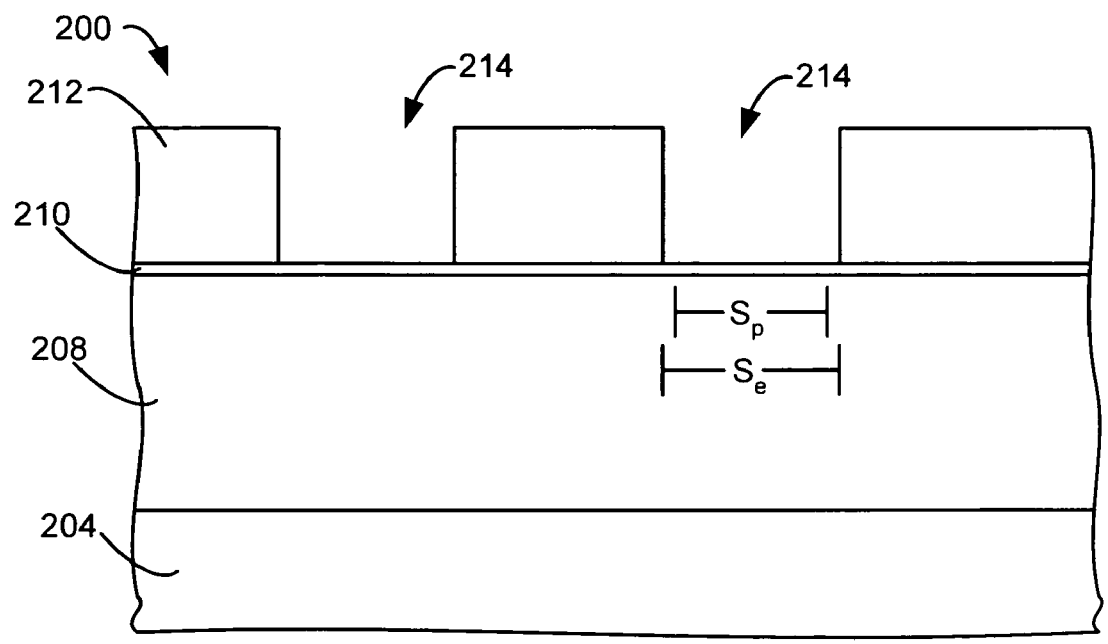
Figure 2D:
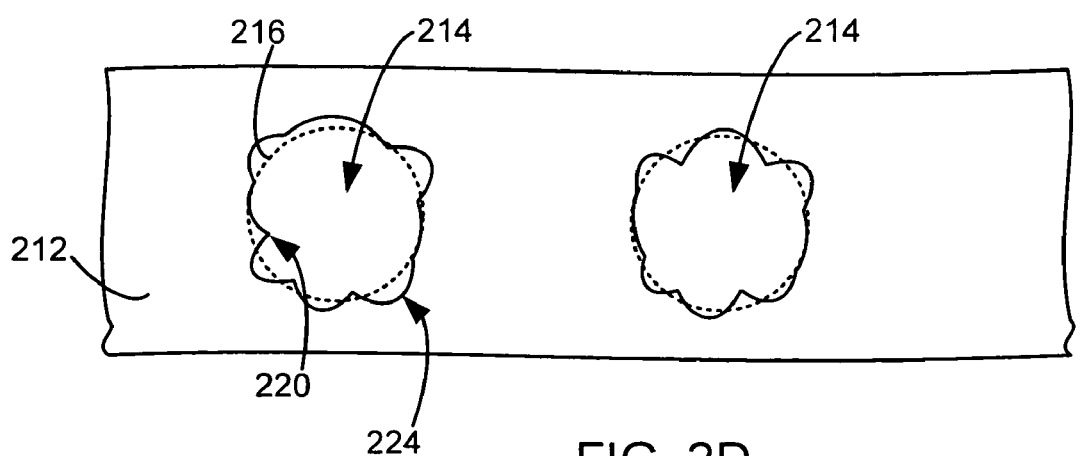

The photoresist features are enlarged (step 108). In one example the photoresist features are enlarged using a laterally etched so that spaces 224 in the photoresist features 214 have widths "$S_e$" that are greater than the widths "$S_p$" of the photoresist features before the etch, as shown in FIG. 2C, which is a cross-sectional view of the stack after the photoresist features are enlarged. FIG. 2D is a top view of the photoresist mask 212 of FIG. 2C. In the specification and claims, a lateral etch is defined as an etch of sides of a mask which form features, wherein the lateral etch increases the size of the widths of the photoresist features. For a trench mask, such a lateral etch may be a trimming of the trench mask. Such lateral etches may also reduce the thickness of the mask. Preferably, the lateral etch does not etch the layer under the photoresist layer 212. An outer dotted line circle 217 indicates a target feature shape after the lateral etching. Other embodiments of the invention do not enlarge the photoresist features or provide enlargement after the striation reduction.

Figure 2E:
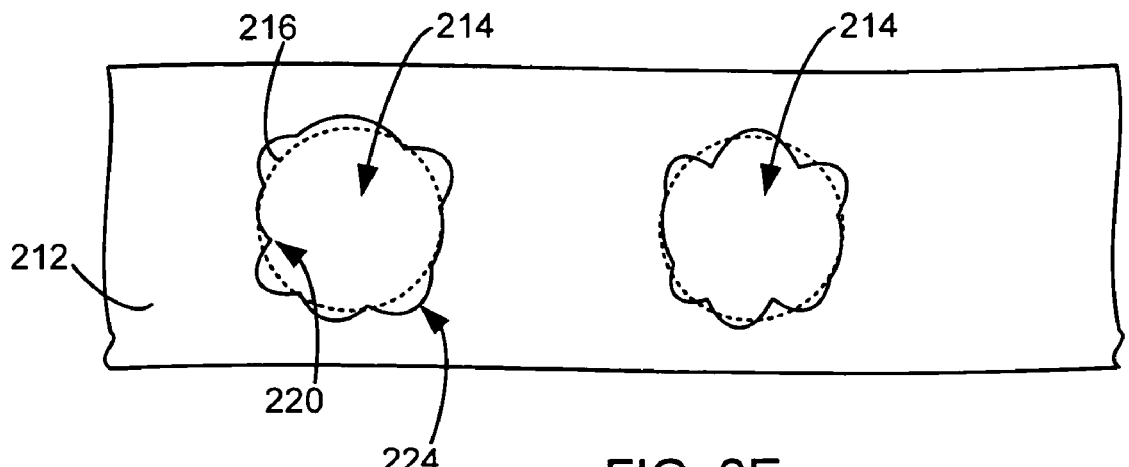
Figure 3:
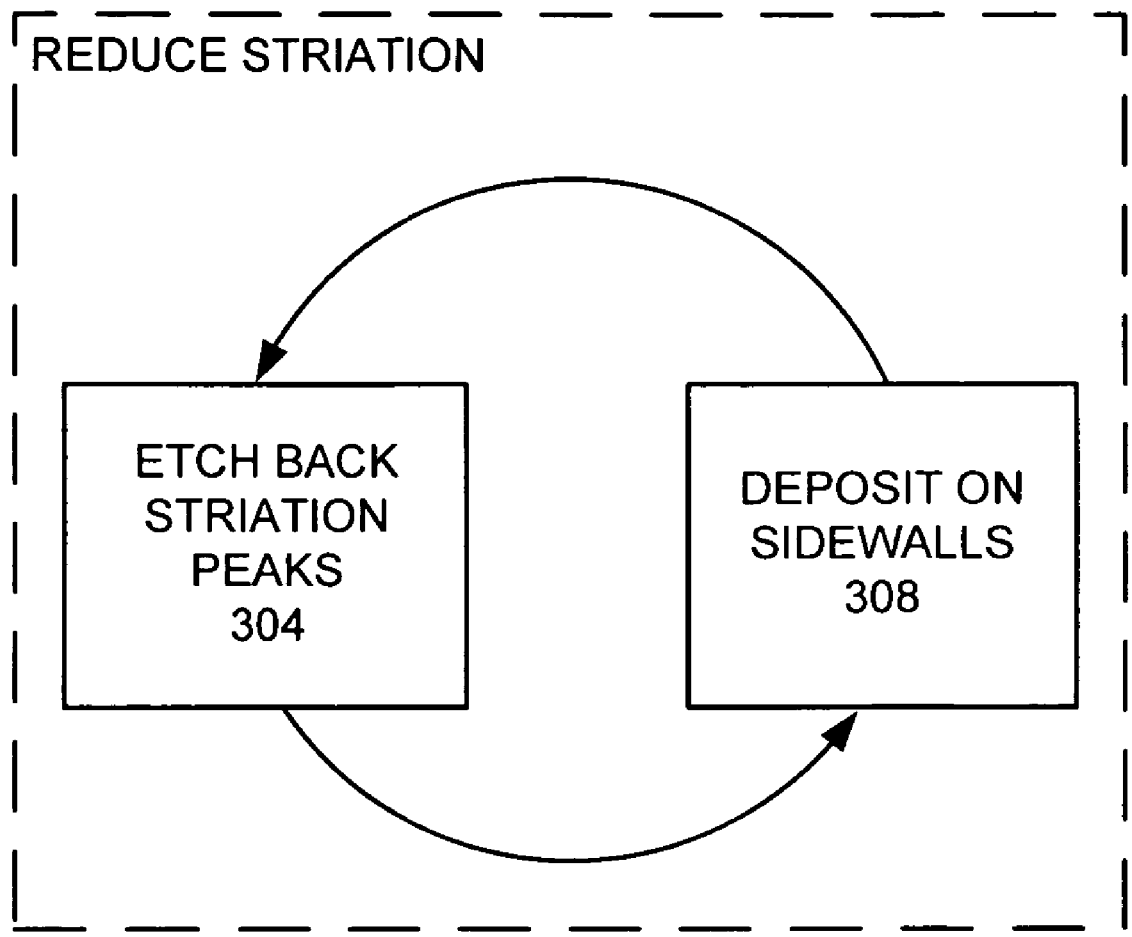
FIG. 3 is a more detailed flow chart of a step of reducing striation.

The striations are reduced (step 112). FIG. 3 is a more detailed flow chart of this step. As shown in FIG. 3, the reduction of the striations comprises at least one cycle of a cyclic process comprising the steps of etching back striation peaks and depositing on the sidewalls of the photoresist features. FIG. 2E shows a top view of the photoresist layer 212 after an etching back of striation peaks 220 (step 304). Without being bound by theory, it is believed that certain etching recipes selectively etch the striation peaks. As shown in FIG, 2E, some of the striation peaks are reduced.

Figure 2F:
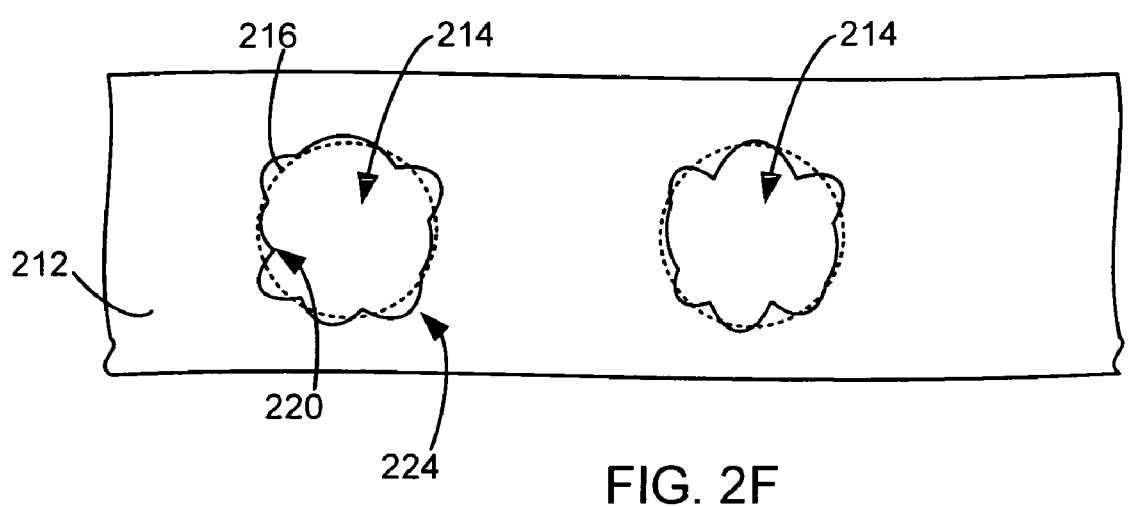
Figure 2G:
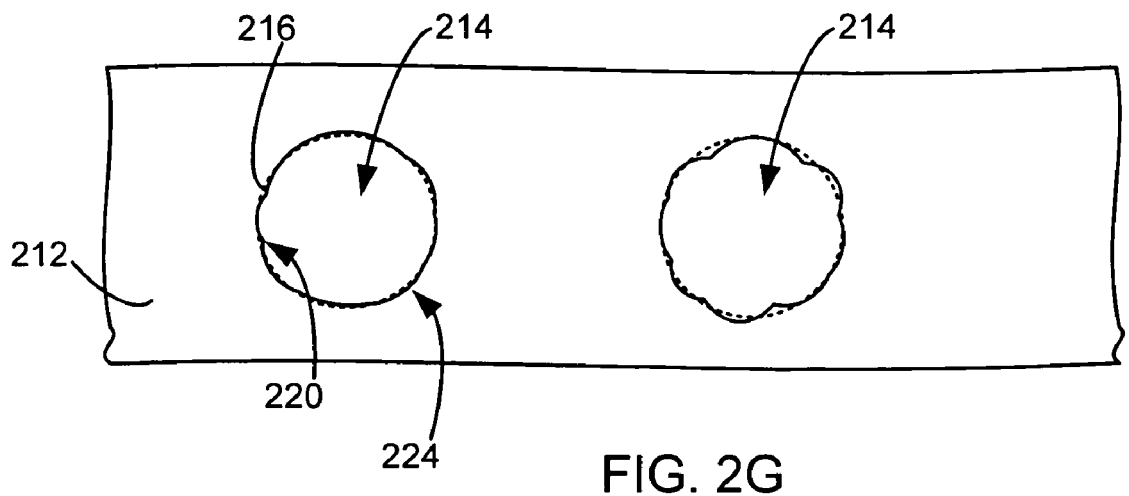

FIG. 2F shows a top view of the photoresist layer 212 after depositing on the sidewall (step 308). FIG. 2G is a top view of the photoresist layer 212 after a plurality of cycles of etching back the striation peaks (step 304) and depositing on the sidewall (step 308). As shown, the striation peaks 220 are greatly reduced, and the striation valleys 224 are significantly filled, thus overall striations are significantly reduced.

Figure 2H:
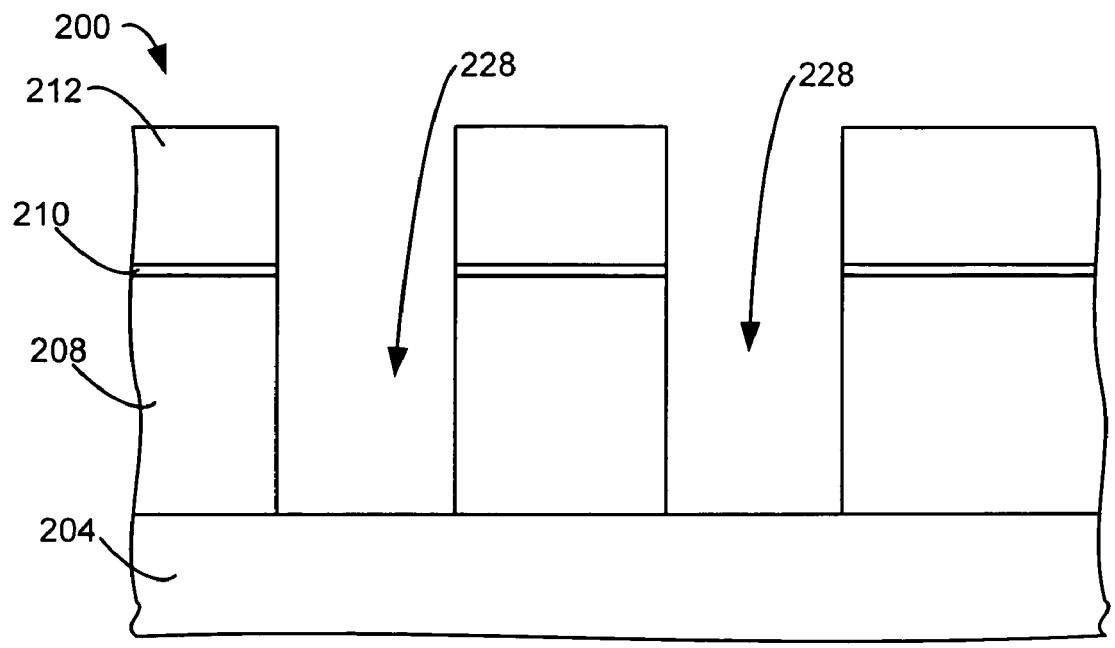
Figure 2I:
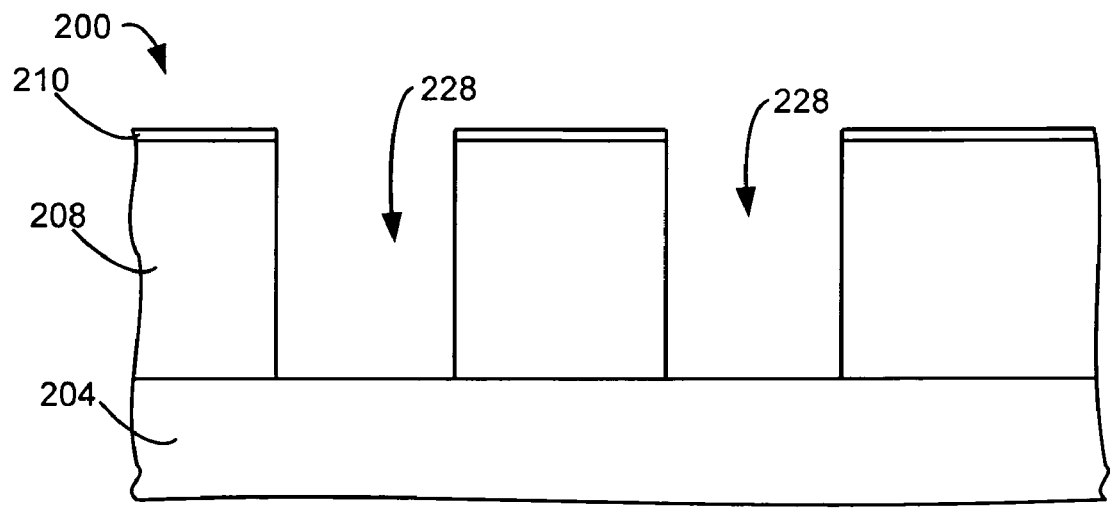

Features 228 are then etched into the etch layer 208 through the photoresist mask 212 (step 116), as shown in FIG. 2H. The photoresist mask 212 is then removed (step 120), as shown in FIG. 2I.

EXAMPLE

In an example of this process patterned photoresist layer is formed (step 104). A substrate 204, with the etch layer 208, an ARC layer 210, and a patterned photoresist mask 212 is placed in an etch chamber.

Figure 4:
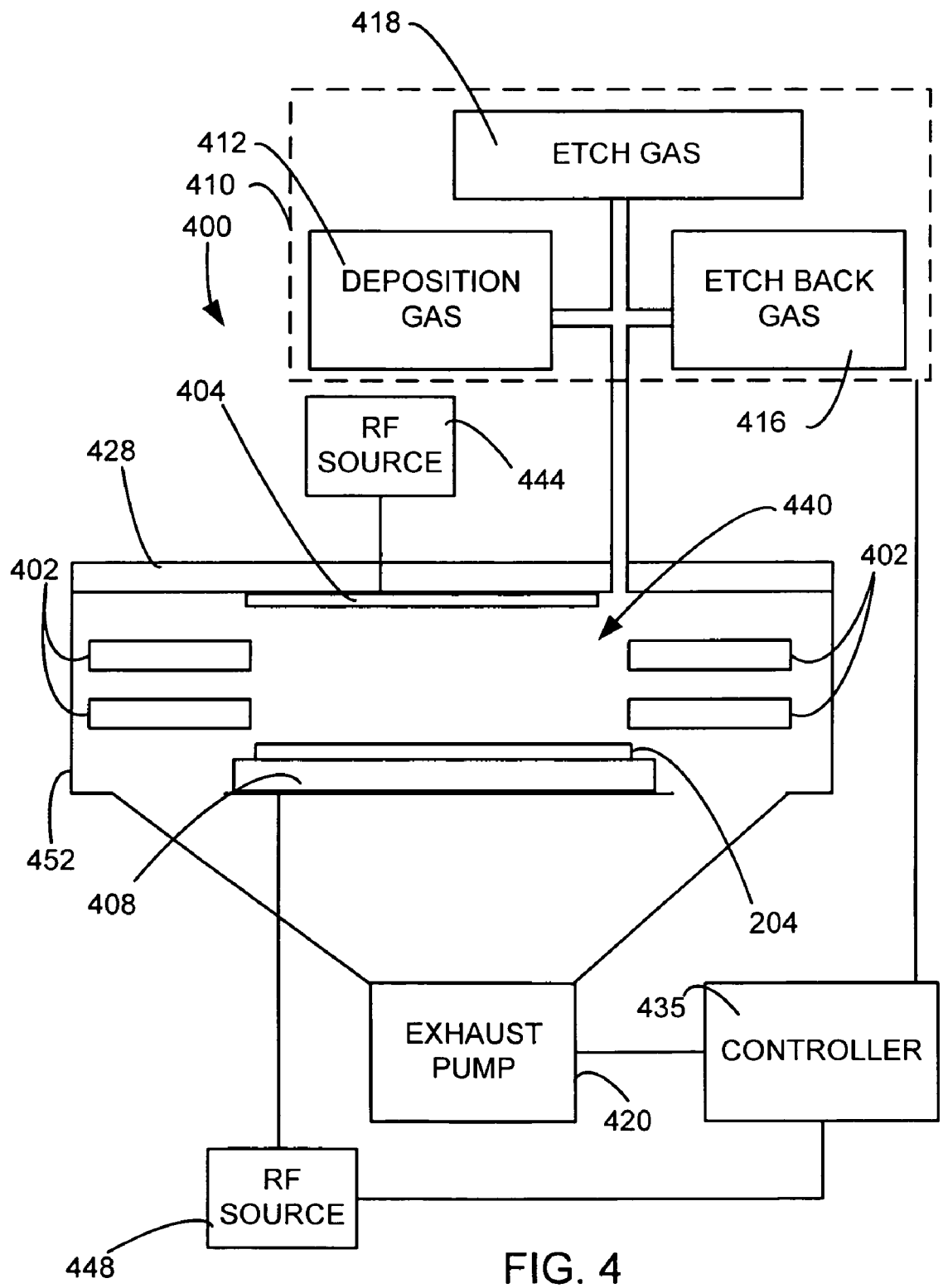
FIG. 4 is a schematic view of a plasma processing chamber that may be used in practicing the invention.

FIG. 4 is a schematic view of an processing chamber 400 that may be used for enlarging the photoresist features, reducing striations, etching, and stripping. The plasma processing chamber 400 comprises confinement rings 402, an upper electrode 404, a lower electrode 408, a gas source 410, and an exhaust pump 420. The gas source 410 comprises a deposition gas source 412 and an etch back gas source 416. The gas source 410 may comprise additional gas sources, such as an etching gas source 418. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. A controller 435 is controllably connected to the RF sources 444, 448, exhaust pump 420, and the gas source 410. The DFC System would be used when the layer to be etched 208 is a dielectric layer, such as silicon oxide, organo silicate glass, or organic dielectric film.

Figure 5A:
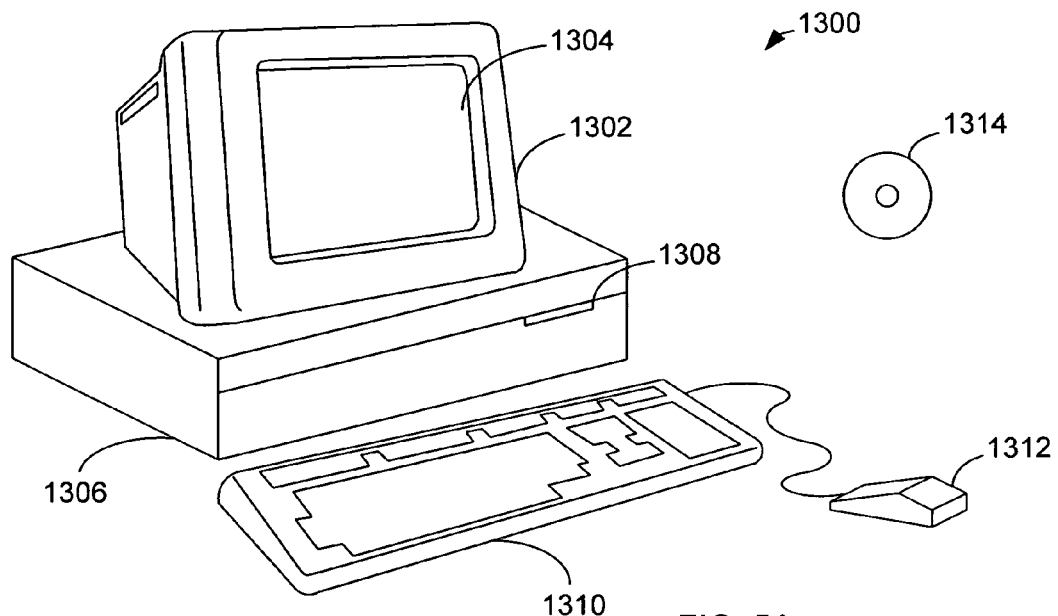
FIGS. 5A-B illustrate a computer system, which is suitable for implementing a controller used in embodiments of the present invention.
Figure 5B:
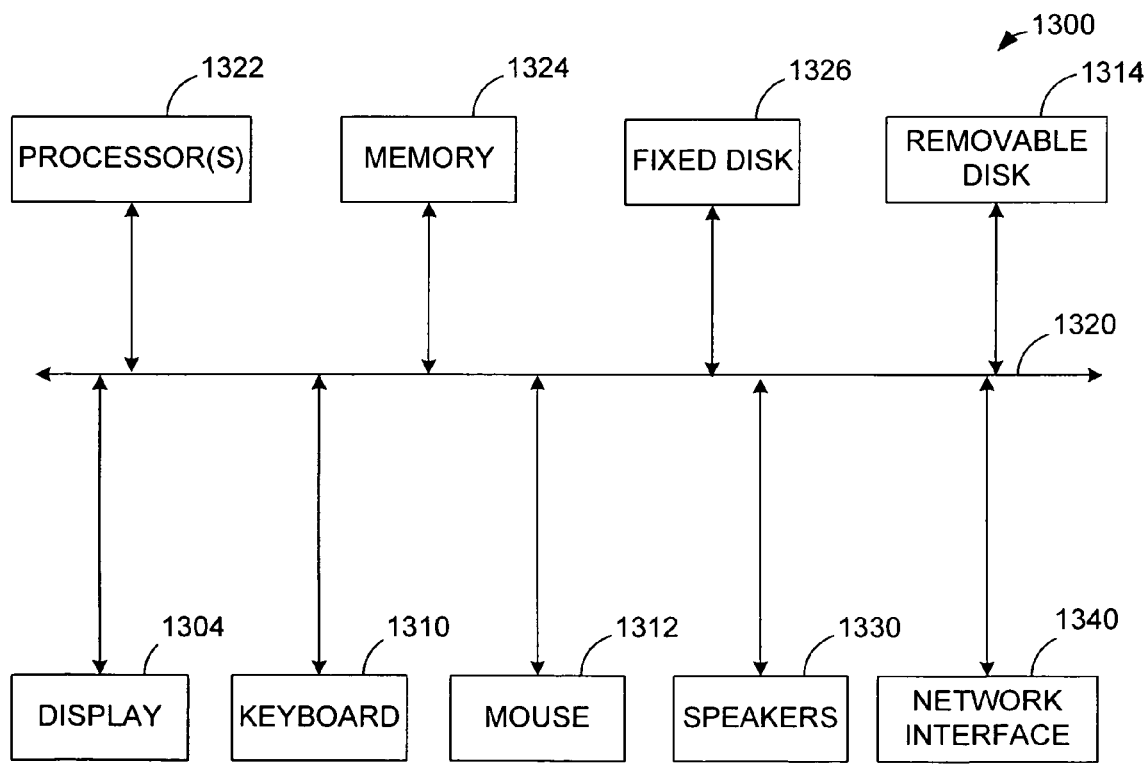

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The photoresist mask features are enlarged (step 108). Such an enlargement process would use, for example, an enlargement gas of at least one of $CF_4$, $H_2$, $NF_3$, $C_xH_yF_z$, and $O_2$. In one example of a recipe for mask feature enlargement provides an etch chamber or plasma processing chamber pressure of 1 to 300 mT. 50 to 800 Watts of power are supplied to the plasma processing chamber at 27 MHz. 0 to 200 sccm of $CF_4$ and 5 to 30 sccm of $O_2$ are provided to the plasma processing chamber. More preferably, the pressure for laterally etching the mask is between 20-150 mT.

The striation is reduced (step 112). Using multiple cycles of the cycle shown in FIG. 3 An example recipe for the step of etching back striation peaks (step 304) provides a halogen (i.e. fluorine, bromine, chlorine) containing gas, such as 100 sccm $CF_4$. In this example, $CF_4$ is the only gas provided during the etch back. A pressure of 20 mTorr is provided to the chamber. The second R-F source 448 provides 600 Watts at a frequency of 27 MHz and 0 Watts a frequency of 2 MHz.

An example of the step of depositing on the sidewalls (step 308) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz.

Features are then etched into the etch layer (step 116). An example of a layer to be etched is may be a conventional etch layer, such as SIN, SiC, an oxide, or low-k dielectric. A conventional etch recipe may be used to etch the layer to be etched.

To remove the mask (step 120) an oxygen ashing may be used.

In a preferred embodiment of the invention, the enlargement of the photoresist features, reduction of striations, and etching the features into the etch layer are done in situ in the same etch chamber, as shown. Preferably, the reducing the striation is performed over at least three cycles. More preferably, the reducing the striation is performed over at least five cycles.

Preferably, the depositing provides a gas containing at least one of a hydrocarbon and fluorohydrocarbon causing the deposition of at least one of a hydrocarbon and fluorohydrocarbon on the sidewalls of the photoresist features.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a feature in an etch layer, comprising:
    forming a patterned photoresist mask over the etch layer with photoresist features with sidewalls wherein the sidewalls of the photoresist features have striations forming peaks and valleys;
    reducing the striations of the sidewalls of the photoresist features comprising at least one cycle, wherein each cycle comprises:
        etching back peaks formed by the striations of the sidewalls of the photoresist features; and
        depositing on the sidewalls of the photoresist features;
    etching features into the etch layer through the photoresist features; and
    removing the photoresist mask.

2. The method, as recited in claim 1, wherein the reducing the striations of the sidewalls comprises at least three cycles.

3. The method, as recited in claim 2, wherein the etching back peaks selectively etches peaks formed by the striations of the side walls of the photoresist features.

4. The method, as recited in claim 3, wherein the depositing on the sidewalls of the photoresist features fills valleys formed by the striations of the sidewalls of the photoresist features.

5. The method, as recited in claim 4, wherein the etching back peaks formed by the striations of the sidewalls of the photoresist features, comprises:
   providing a halogen containing gas; and
   forming a plasma from the halogen containing gas.

6. The method, as recited in claim 5, wherein the depositing on the sidewalls of the photoresist features, comprises depositing at least one of a hydrocarbon and a hydrofluorocarbon on the sidewalls of the photoresist features.

7. The method, as recited in claim 6, wherein the depositing on the sidewalls of the photoresist features, comprises:
   providing a deposition gas comprising at least one of a hydrocarbon and a hydrofluorocarbon; and
   forming a plasma from the deposition gas.

8. The method, as recited in claim 7, further comprising laterally etching the photoresist features to enlarge the photoresist features before etching the feature through the sidewall layers.

9. The method, as recited in claim 7, further comprising laterally etching the photoresist features to enlarge the photoresist features before reducing the striation.

10. The method, as recited in claim 1, wherein the etching back peaks selectively etches peaks formed by the striations of the side walls of the photoresist features.

11. The method, as recited in claim 1, wherein the depositing on the sidewalls of the photoresist features fills valleys formed by the striations of the sidewalls of the photoresist features.

12. The method, as recited in claim 1, wherein the etching back peaks formed by the striations of the sidewalls of the photoresist features, comprises:
   providing a halogen containing gas; and
   forming a plasma from the halogen containing gas.

13. The method, as recited in claim 1, wherein the depositing on the sidewalls of the photoresist features, comprises depositing at least one of a hydrocarbon an hydrofluorocarbon on the sidewalls of the photoresist features.

14. The method, as recited in claim 1, wherein the depositing on the sidewalls of the photoresist features, comprises:
   providing a deposition gas comprising at least one of a hydrocarbon and hydrofluorocarbon; and
   forming a plasma from the deposition gas.

15. The method, as recited in claim 1, further comprising laterally etching the photoresist features to enlarge the photoresist features before etching the feature through the sidewall layers.

16. The method, as recited in claim 1, further comprising laterally etching the photoresist features to enlarge the photoresist features before reducing the striation.

17. A method of etching features in an etch layer disposed below a patterned photoresist mask with photoresist features with sidewalls wherein the sidewalls of the photoresist features have striations forming peaks and valleys, comprising:
   reducing the striations of the sidewalls of the photoresist features comprising at least one cycle, wherein each cycle comprises:
      providing a striation peak etch back gas;
      generating a plasma from the striation peak etch back gas;
      stopping the striation peak etch back gas;
      providing a photoresist feature sidewall deposition gas;
      generating a plasma from the photoresist feature sidewall deposition gas; and
      stopping the photoresist feature sidewall deposition gas;
   etching the etch layer; and
   removing the photoresist mask.

18. The method, as recited in claim 17, wherein the reducing the striations of the sidewalls comprises at least three cycles.

* * * * *